United States Patent
Yoon

(10) Patent No.: US 10,082,585 B2
(45) Date of Patent: Sep. 25, 2018

(54) ARRAY SUBSTRATE FOR X-RAY DETECTOR AND X-RAY DETECTOR COMPRISING THE SAME

(71) Applicant: LG Display Co., Ltd., Seoul (KR)

(72) Inventor: JaeHo Yoon, Chilgok-gun (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/391,537

(22) Filed: Dec. 27, 2016

(65) Prior Publication Data
US 2017/0192108 A1    Jul. 6, 2017

(30) Foreign Application Priority Data

Dec. 31, 2015 (KR) .......................... 10-2015-0191497

(51) Int. Cl.
| | | |
|---|---|---|
| *G01D 18/00* | (2006.01) | |
| *G01T 1/24* | (2006.01) | |
| *G01T 7/00* | (2006.01) | |
| *H01L 21/66* | (2006.01) | |
| *H01L 27/146* | (2006.01) | |

(52) U.S. Cl.
CPC .............. *G01T 1/241* (2013.01); *G01T 7/00* (2013.01); *H01L 22/34* (2013.01); *H01L 27/14612* (2013.01); *H01L 27/14676* (2013.01)

(58) Field of Classification Search
CPC .............. H01L 22/34; G01R 1/07328; G01R 31/31813; G01R 31/2884
See application file for complete search history.

(56) References Cited

U.S. PATENT DOCUMENTS

| | | | |
|---|---|---|---|
| 2003/0213953 A1* | 11/2003 | Sohn .................. | H01L 22/32 257/48 |
| 2008/0277659 A1 | 11/2008 | Hsu et al. | |
| 2014/0145252 A1* | 5/2014 | Kim ................ | H01L 27/14658 257/292 |
| 2014/0348303 A1 | 11/2014 | Ham | |

FOREIGN PATENT DOCUMENTS

| | | |
|---|---|---|
| KR | 1020120057422 A | 6/2012 |
| KR | 1020120057424 A | 6/2012 |

OTHER PUBLICATIONS

European Search Report dated May 10, 2017 in corresponding European patent application No. 16207482.

* cited by examiner

*Primary Examiner* — Kenneth J Malkowski
(74) *Attorney, Agent, or Firm* — Polsinelli PC

(57) ABSTRACT

The present disclosure relates to an array substrate for an X-ray detector and an X-ray detector including the same. The array substrate is defined as an active area and a pad area, wherein the pad area comprises a plurality of test areas comprising a first test pattern and a second test pattern, the first test pattern comprises a first gate electrode on a substrate, a first active layer on the first gate electrode, a first source/drain electrode on the first active layer, and a first data line on the first source/drain electrode, and the second test pattern comprises a first lower electrode on the substrate, a first photoconductive layer on the first lower electrode, and a first upper electrode on the first photoconductive layer, thereby measuring the characteristic of each of a transistor and an optical detector with high accuracy.

17 Claims, 13 Drawing Sheets

400

ARRAY SUBSTRATE FOR X-RAY DETECTOR AND X-RAY DETECTOR COMPRISING THE SAME

CROSS-REFERENCE TO RELATED APPLICATION

The present application claims the priority of Korean Patent Application No. 10-2015-0191497 filed in the Republic of Korea on Dec. 31, 2015, which is hereby incorporated by reference in its entirety.

BACKGROUND

Field of the Disclosure

The present disclosure relates to an array substrate for an X-ray detector and an X-ray detector comprising the same, and more particularly, to an array substrate for an X-ray detector and an X-ray detector including the same, for capable of separately measuring characteristics of a transistor and an optical detector of the X-ray detector with a high accuracy.

Description of the Background

An X-ray inspection method that has been widely used for medical diagnosis requires an X-ray sensing film and a film printing time to obtain a result.

However, recently, by virtue of development of semiconductor technologies, a digital X-ray detector using a thin film transistor (TFT) has been researched and developed. The digital X-ray detector advantageously diagnoses a result in real time immediately after an X-ray is taken by using a TFT as a switching device.

In general, two different types are used in the digital X-ray detector; a direct type DXD method and an indirect type DXD method. The direct type DXD method is detecting current by as much as electric charges received from a selenium layer by a pixel electrode of a TFT and performing a signaling processing procedure using a structure including an amorphous Se layer stacked on a TFT array substrate and a transparent electrode formed on the amorphous Se layer. The indirect type DXD method is converting a visible ray into an electrical signal by a PIN diode and performing a series of signal processing procedures when an X-ray is converted into the visible ray by a scintillator.

Recently, an X-ray detector using an indirect type DXD method has been most spotlighted. The X-ray detector includes an optical diode formed on an array substrate to detect an X-ray, and a scintillator disposed on the optical diode.

FIG. 1 is a schematic diagram illustrating a cesium-applied area 2 of a scintillator in an X-ray detector. FIG. 2 is a schematic diagram of a test pattern present outside an array substrate in the conventional X-ray detector. As illustrated in FIG. 1, the cesium-applied area 2 of the scintillator is formed over an active area of an array substrate 1 such that it does not overlap connection lines 3 for connecting COFs with signal lines of the array substrate. In this regard, there is a problem in that a cesium component corrodes metallic lines of the array substrate 1 of a thin film transistor, and thus an uppermost layer of the active area of the array substrate is typically protected by an organic layer. Accordingly, as illustrated in FIG. 2, a test pattern is added to an edge portion of a sheet material of a base substrate outside the array substrate to thereby evaluate panel characteristics. However, the test pattern added to the edge portion of the sheet material of the base substrate is distant from the active area of the array substrate, and thus the accuracy of the test is lowered.

In addition, in the X-ray detector, a thin film transistor and an optical diode are present in one pixel due to the structural characteristics, and thus the characteristics of both the thin film transistor and the optical diode are shown together. Accordingly, it is difficult to evaluate unique characteristics of each of the thin film transistor and optical diode. Therefore, a solution for the issue is necessary.

SUMMARY

Accordingly, the present disclosure is directed to an array substrate of an X-ray detector and an X-ray detector including the array substrate that substantially obviate one of more problems due to limitations and disadvantages of the prior art.

It is an object of the present disclosure to provide an array substrate for an X-ray detector for capable of separately measuring characteristics of a transistor and an optical detector of the X-ray detector with a high accuracy.

In addition, another object of the present disclosure is to provide an X-ray detector including the array substrate.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, an array substrate for an X-ray detector, the array substrate being defined as an active area and a pad area, wherein the pad area includes a plurality of test areas including a first test pattern and a second test pattern, the first test pattern includes a first gate electrode on a substrate, a first active layer on the first gate electrode, a first source/drain electrode on the first active layer, and a first data line on the first source/drain electrode, and the second test pattern includes a first lower electrode on the substrate, a first photoconductive layer on the first lower electrode, and a first upper electrode on the first photoconductive layer.

The pad area may further include a plurality of chip on films (COFs) including a plurality of connection lines, and the plurality of test areas may be disposed between a plurality of adjacent COFs and a plurality of adjacent connection lines.

The test area may include a plurality of first and second test patterns.

The pad area may further include a plurality of measurement pad units that are electrically connected to at least one of the first and second test patterns.

The measurement pad unit may include the second gate electrode on the substrate, a second active layer on the second gate electrode, a second source/drain electrode on the second active layer, a first insulation layer on the second source/drain electrode, a second lower electrode on the first insulation layer, a second insulation layer on the second lower electrode, a bias line on the second insulation layer, and a third insulation layer on the bias line, and the second lower electrode may be electrically connected to the second gate electrode through a first hole, may be electrically connected to the second source/drain electrode through a second hole, and may be electrically connected to the bias line through a third hole.

In accordance with one aspect of the present disclosure, an X-ray detector includes the array substrate for an X-ray detector.

It is to be understood that both the foregoing general description and the following detailed description are exemplary and explanatory and are intended to provide further explanation of the present disclosure as claimed.

BRIEF DESCRIPTION OF DRAWINGS

The accompanying drawings, which are included to provide a further understanding of the present disclosure and are incorporated in and constitute a part of this application, illustrate aspect(s) of disclosure and together with the description serve to explain the principle of the disclosure.

In the drawings.

DETAILED DESCRIPTION

Figure 1:
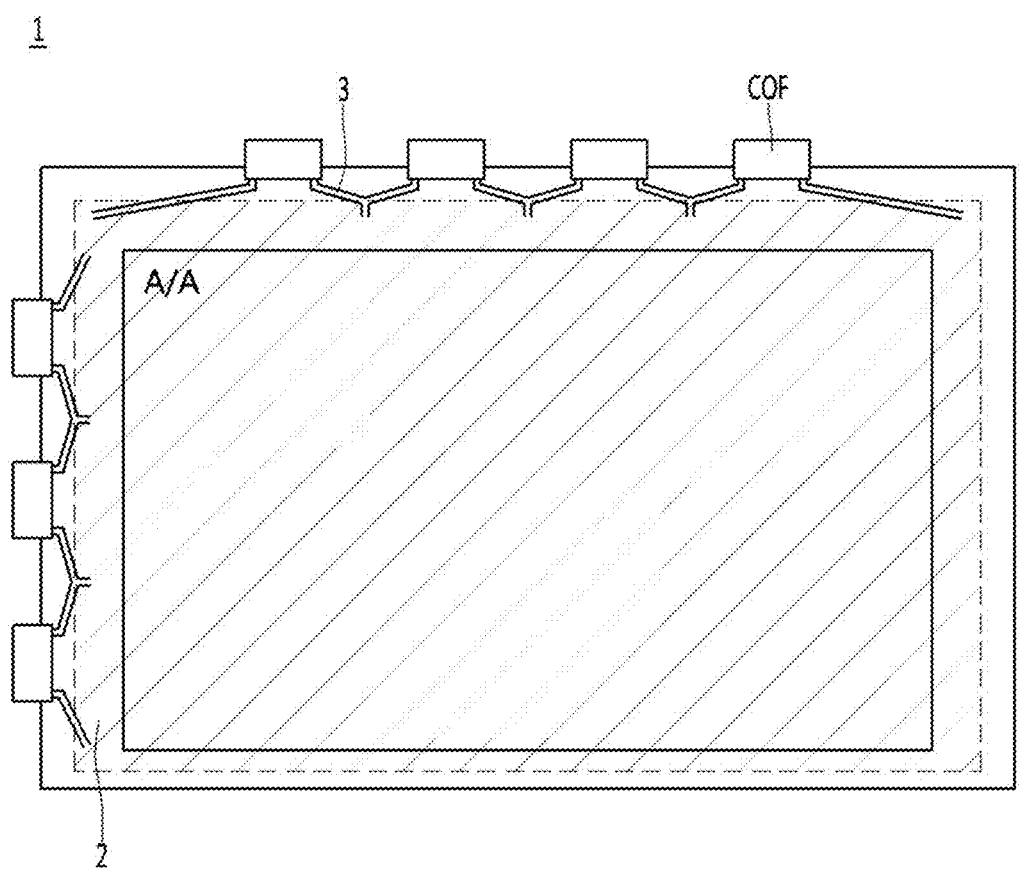
FIG. 1 is a schematic diagram illustrating a cesium-applied area of a scintillator in an X-ray detector.

Reference will now be made in detail to the aspects of the present disclosure, examples of which are illustrated in the accompanying drawings. Whenever possible, the same reference numbers will be used throughout the drawings to refer to the same or like parts.

It will be understood that when an element such as a layer, a film, an electrode, a plate, or a substrate is referred to as being "on" or "under" another element, the element may be directly on another element or an intervening element may also be present.

Spatially relative terms, such as "below", "beneath", "lower", "above", "upper", and the like, may be used herein for ease of description to describe one element or feature's relationship to another element(s) or feature(s) as illustrated in the figures. Elements depicted in the drawings are not necessarily to scale with one another, rather individual elements may be enlarged or reduced in order to more easily comprehend the elements in the context of the descriptions.

Figure 3:
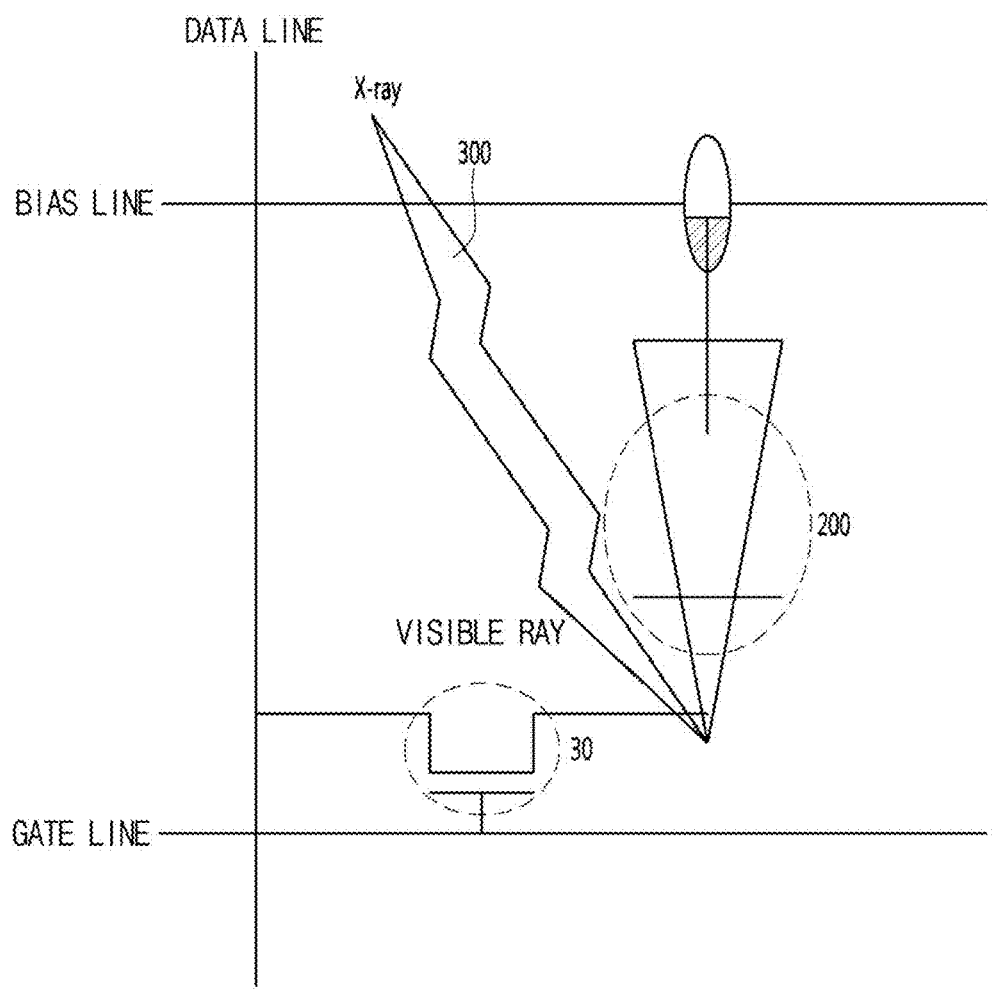
FIG. 3 is a cross-sectional view illustrating an operation of an X-ray detector according to an aspect of the present disclosure.
Figure 4:
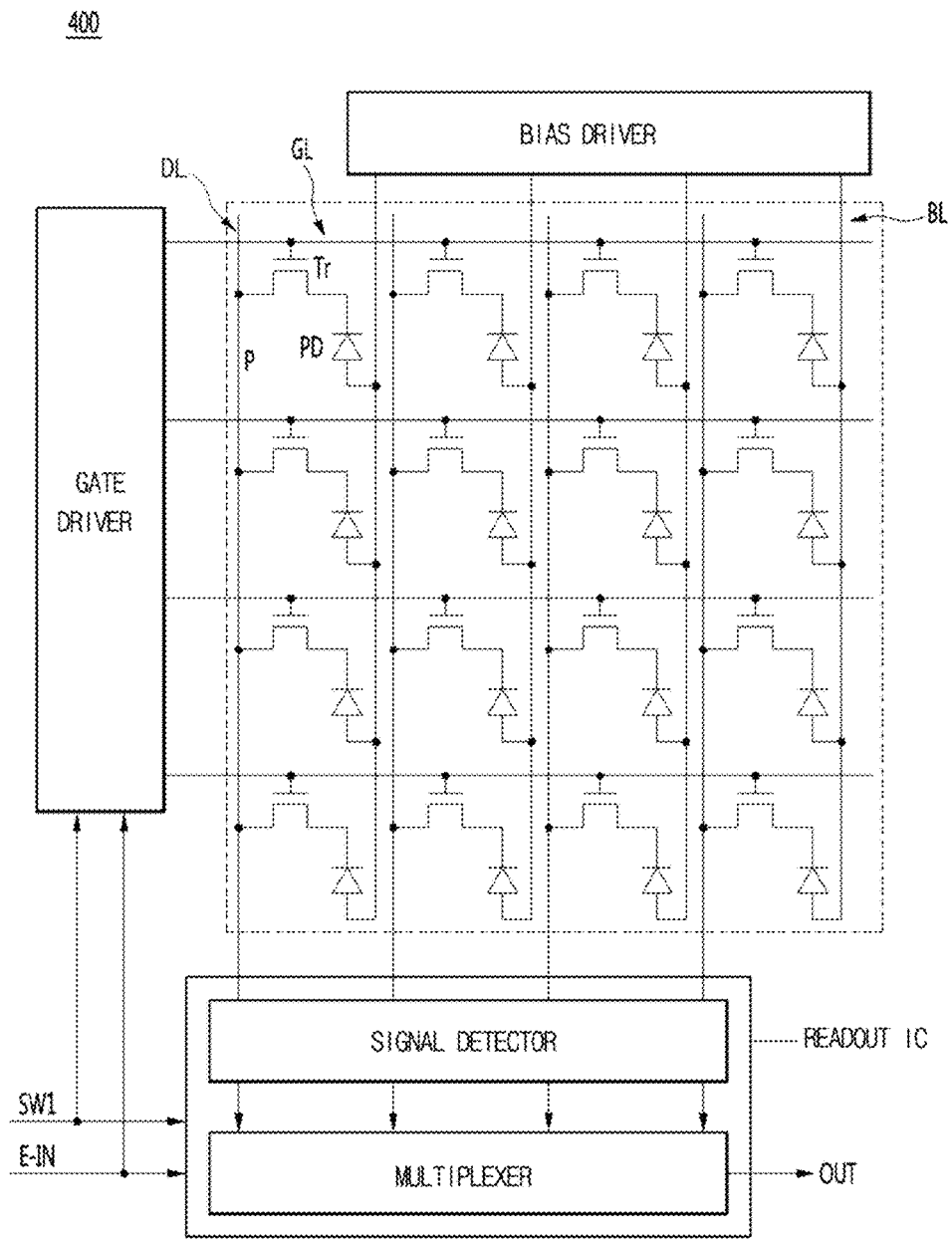
FIG. 4 is a schematic diagram illustrating a structure of an X-ray detector according to an aspect of the present disclosure.

FIG. 3 is a cross-sectional view illustrating an operation of an X-ray detector according to an aspect of the present disclosure. FIG. 4 is a schematic diagram illustrating a structure of an X-ray detector according to an aspect of the present disclosure.

Figure 2:
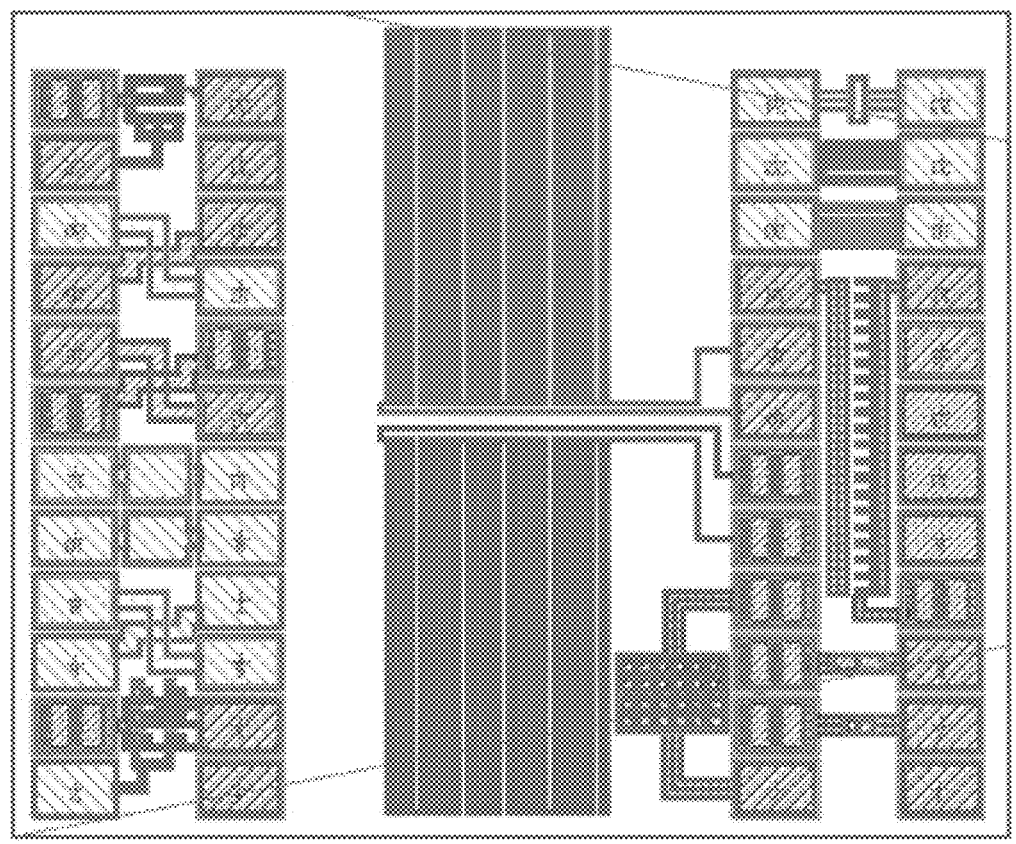
FIG. 2 is a schematic diagram of a test pattern present outside an array substrate in a conventional X-ray detector.

In an indirect-type X-ray detector, an optical detector 200 may be formed on an array substrate in order to detect an X-ray and an optical converter 300 is disposed on the optical detector 200 as shown in FIG. 2.

As illustrated in FIG. 4, the optical converter 300 that receives an X-ray may convert the X-ray into light with a wavelength that is most sensitive to the optical detector 200 via optical conversion and the optical detector 200 may convert the converted light into an electrical signal and transmit the converted electrical signal as an image signal through a transistor. A thin film transistor illustrated in FIGS. 3 and 4 may include a gate electrode 21, a gate insulation film 16 formed on the gate electrode 21, an active layer formed on the gate insulation film 16, and a source electrode and a drain electrode that are connected to one end and the other end of the active layer 22 and spaced apart from each other.

As illustrated in FIG. 4, an X-ray detector 400 according to an aspect of the present disclosure may include a pixel area, a bias driver, a gate driver, and a readout integrated circuit (IC).

The pixel area may detect an X-ray emitted from an X-ray generator and may photoelectrically convert the detected signal into an electric detection signal as an output signal.

The pixel area may include a plurality of optical detection pixels P that are arranged in a matrix form around intersections between a plurality of gate lines GL and a plurality of data lines DL. The plurality of gate lines GL and the plurality of data lines DL may be arranged to be perpendicular to each other. Although FIG. 4 illustrates an example of 16 optical detection pixels P that are arranged in 4 rows and 4 columns, the present disclosure is not limited thereto, and the number of optical detection pixels P may be variously selected.

Each of the optical detection pixels P may include an optical detector for detecting an X-ray to output a detection signal, e.g., an optical detection voltage and a transistor as a switching device for transmitting an electrical signal output from the optical detector in response to a gate pulse.

The optical detector PD according to an aspect of the present disclosure may detect an X-ray emitted from the X-ray generator and output a detected signal as the detection signal. The optical detector 200 may be a device for converting emitted light into an electrical signal according to the photoelectric effect and may be, for example, a PIN diode.

The transistor Tr may be a switching device for transmitting the detection signal output from the optical detector. The gate electrode of the transistor may be electrically connected to the gate lines GL and the source electrode may be electrically connected to the readout IC through the data lines DL.

The bias driver may apply a driving voltage to a plurality of bias lines BL. The bias driver may selectively apply a reverse bias or forward bias to the optical detector.

The gate driver may sequentially apply gate pulses with a gate on voltage level to the plurality of gate lines GL. Transistors of the optical detection pixels P may be turned on in response to the gate pulse. When the transistor is turned on, the detection signal output from the optical detector 200 may be input to the readout IC through the transistor and the data line DL.

The gate driver may be formed of an IC and may be installed in one side of the pixel area or may be formed on the same substrate as the pixel area through a thin film process.

The readout IC may read out the detection signal output from the transistor that is turned on in response to the gate pulse. The readout IC may read out the detection signal output from the photosensitive pixels P in an offset readout period in which an offset image is read out and a X-ray readout period in which the detection signal is read out after an X-ray exposure.

The readout IC may read the detection signal and transmit the detection signal to a predetermined signal processor and the signal processor may convert the detection signal in a digital signal and display the detection signal as an image. The readout IC may include a signal detector and a multiplexer. In this case, the signal detector may further include a plurality of amplification units corresponding to each of the data lines DL. Each of the amplification units may include an amplifier, a capacitor, and a reset device.

An array substrate for an X-ray detector according to as aspect of the present disclosure may be defined as an active area and a pad area.

Figure 5:
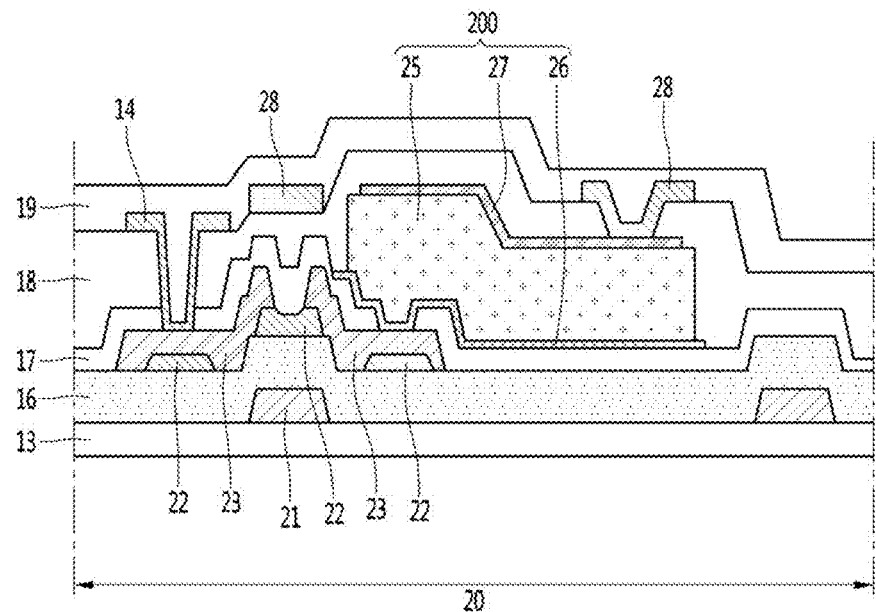
FIG. 5 is a cross-sectional view of an active area of an array substrate according to an aspect of the present disclosure.

FIG. 5 is a cross-sectional view of an active area of the array substrate according to an aspect of the present disclosure. Hereinafter, the present disclosure will be described with reference to FIG. 5.

The active area 20 may include a plurality of data lines 14, a plurality of gate lines, a plurality of pixel areas defined as the plurality of data lines 14 and the plurality of gate lines cross each other, a plurality of optical detectors 200 that are respectively positioned in the plurality of pixel areas and convert a photoelectric signal into an electrical signal, and a plurality of TFTs 30 that perform a switching function in order to drive the plurality of optical detectors 200.

The TFT 30 may include a gate electrode 21 connected to a gate line, an active layer 22 positioned on the gate electrode 21, a source electrode 23 for connection between one end of the active layer 22 and the data lines 14, and a drain electrode 23 connected to the other end of the active layer 22. The drain electrode 23 may be connected to the optical detector 200.

The array substrate 100 may further include the data line 14 connected to the source electrode 23 and a bias line 28 for applying a bias voltage to control electrons and holes of the optical detector 200. The bias line 28 may be formed of an opaque metallic material.

The gate electrode 21 may be formed of, but is not limited to, a material such as aluminum (Al), molybdenum (Mo), and an alloy thereof.

The active layer 22 may include a first amorphous silicon layer that is not doped with impurities and a second amorphous silicon layer that is doped with n-type dopants.

The source/drain electrode 23 may be formed of, but is not limited to, a material such as aluminum (Al), molybdenum (Mo), and an alloy thereof.

A first protective layer 17 may include a first contact hole for exposing a portion of the drain electrode 23, the source electrode 23 and the data line 14 may be connected and the drain electrode 23 and a lower electrode 26 of the optical detector 200 may be connected through the first contact hole.

A second protective layer 18 may be formed on the first protective layer 17 and an upper electrode 27 of the optical detector 200 and the second protective layer 18 may include a second contact hole for exposing a portion of the upper electrode 27. The upper electrode 27 and the bias line 28 may be connected through the second contact hole.

A third protective layer 19 may be formed on the second protective layer 18 and the bias line 28 and may not include a contact hole in the active area 20.

Figure 6:
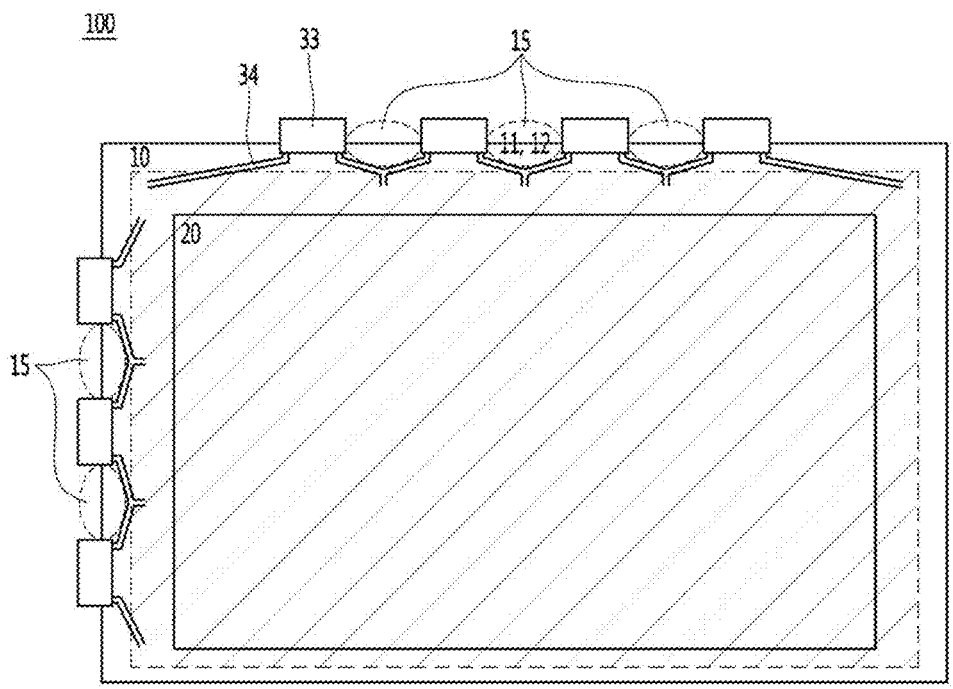
FIG. 6 is a schematic diagram of an array substrate including a test area including first and second test patterns according to an aspect of the present disclosure.

FIG. 6 is a schematic diagram of an array substrate 100 including a plurality of test areas 15 each including a first test pattern 11 and a second test pattern 12 according to an aspect of the present disclosure. As illustrated in FIG. 6, a pad area 10 may be an edge portion surrounding the active area 20 in the array substrate and may include a plurality of test areas 15 including the first test pattern and the second test pattern. The test area 15 according to an aspect of the present disclosure may refer to a portion including the first test pattern 11 and the second test pattern 12 which will be described below.

Conventionally, the test area is disposed outside the array substrate and, thus, when characteristics of devices included in the array substrate are evaluated, the evaluation accuracy tends to be degraded. Accordingly, according to an aspect of the present disclosure, the test areas 15 are included as part of the array substrate 100.

The pad area 10 may include a chip on film (COF) 33 for connection between an array substrate and a printed circuit board (PCB) for providing a driving voltage to a plurality of signal lines included in the active area 20, the COF may be connected to the signal lines of the active area 20 through connection lines 34 and, thus, according to an aspect of the present disclosure, the plurality of test areas 15 may be disposed between a plurality of adjacent COFs and a plurality of adjacent connection lines. In more detail, a distance between the adjacent COFs 33 may be about 0.5 to about 2 mm, but is not limited thereto.

Figure 7:
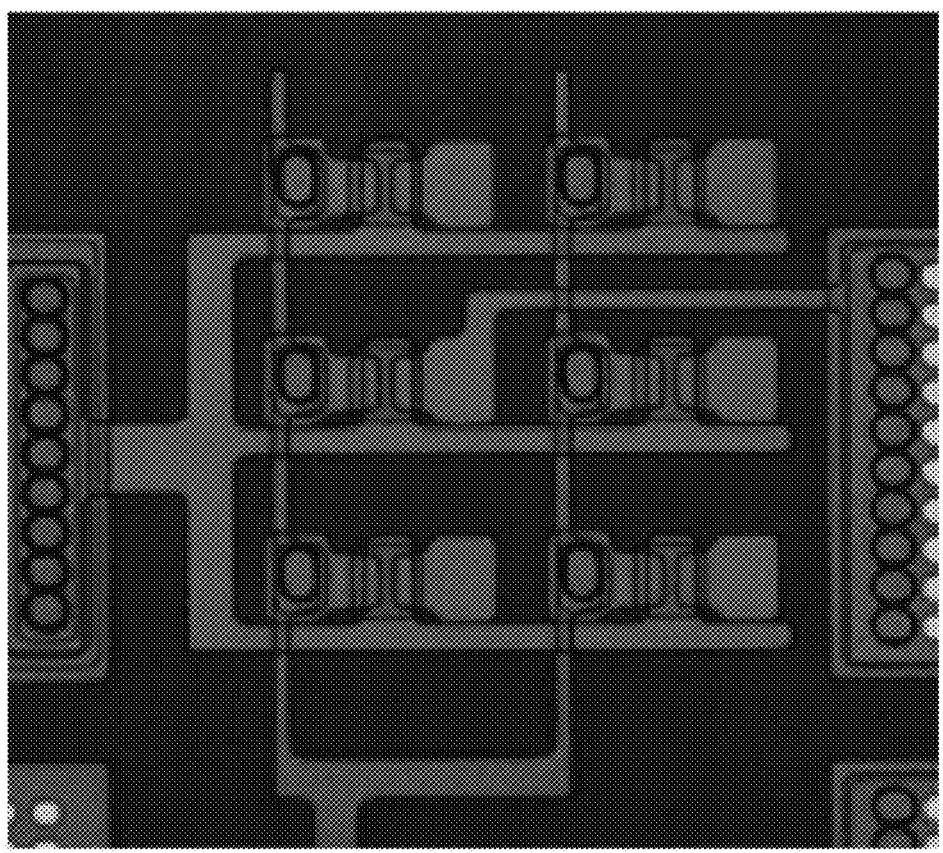
FIG. 7 is a photographic image of the first test pattern according to an aspect of the present disclosure.
Figure 8A:
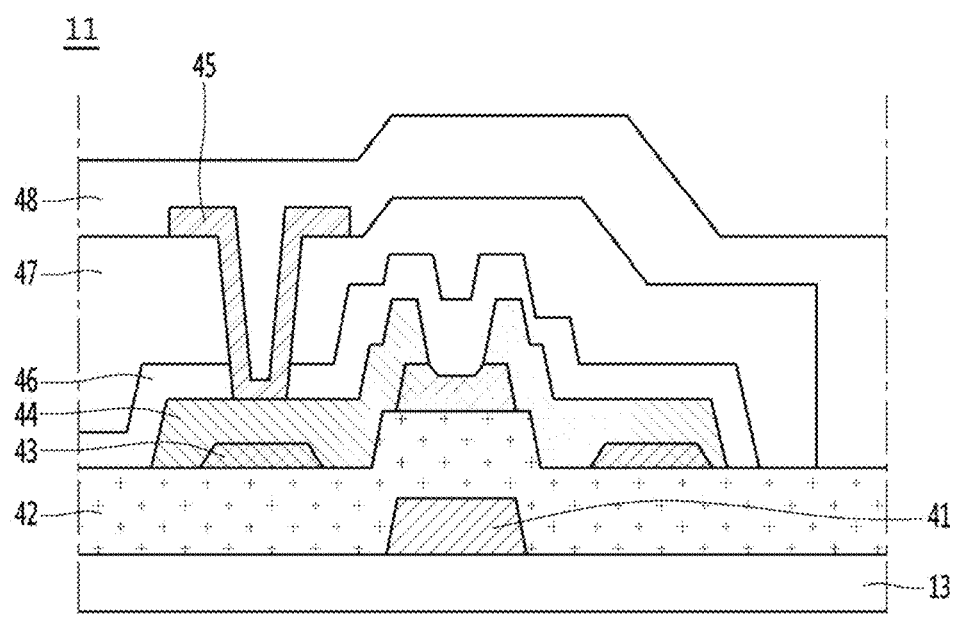
FIG. 8A is a cross-sectional view of the first test pattern according to an aspect of the present disclosure.
Figure 8B:
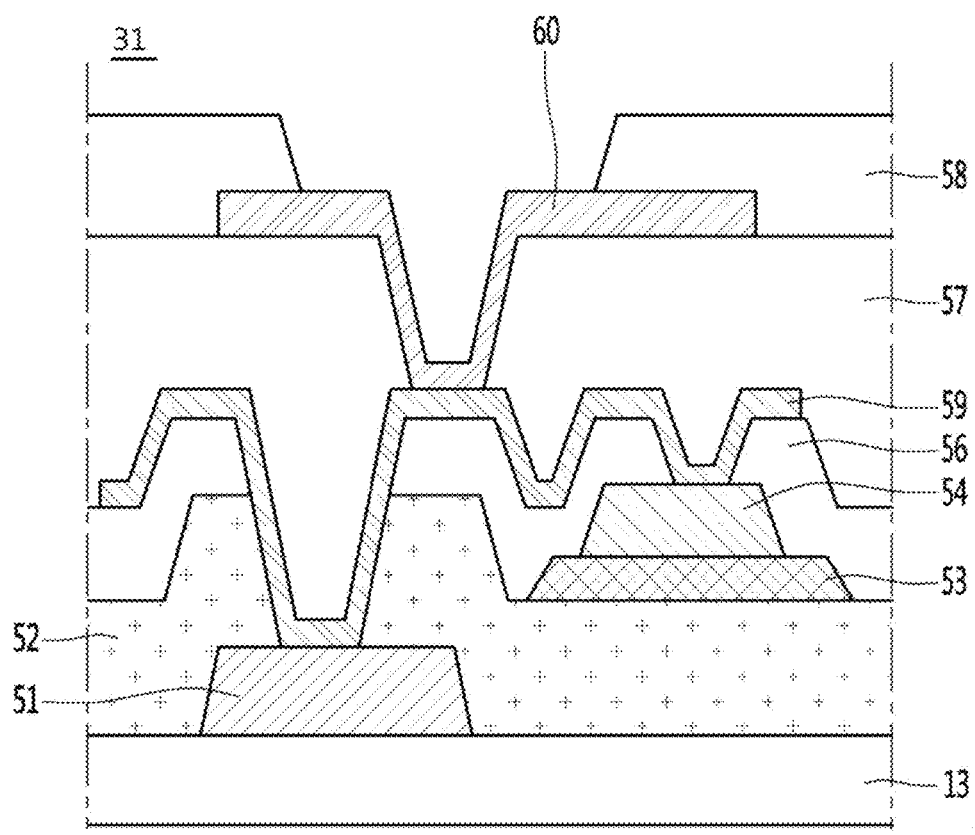
FIG. 8B is a cross-sectional view of a pad unit for measurement of the first test pattern according to an aspect of the present disclosure.
Figure 9:
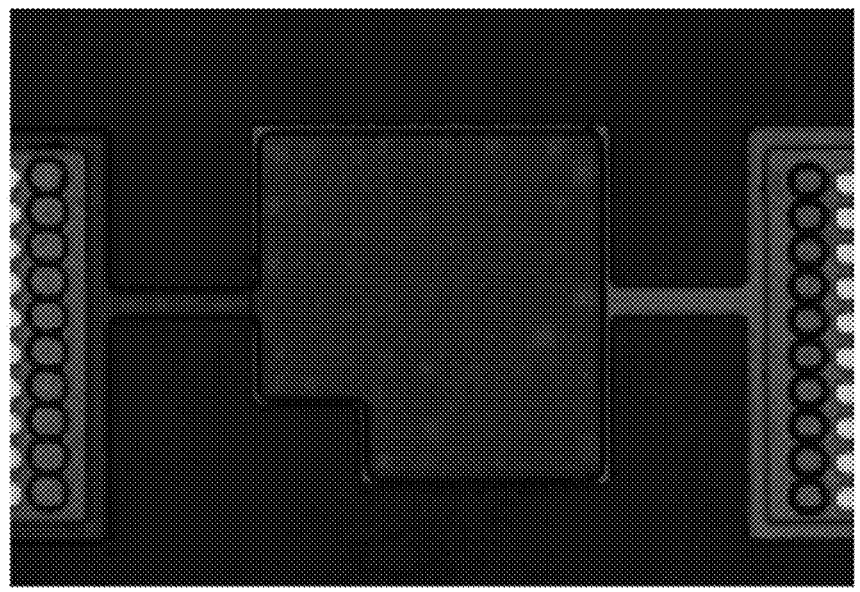
FIG. 9 is a photographic image of the second test pattern according to an aspect of the present disclosure.
Figure 10A:
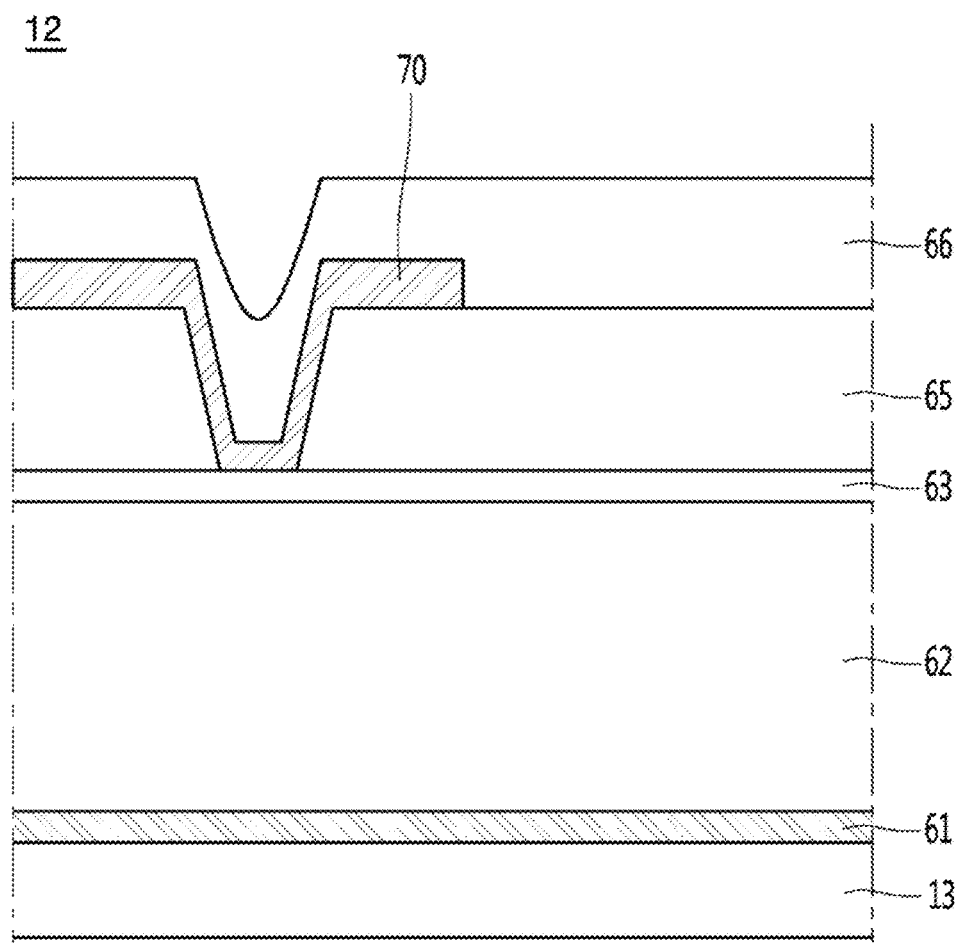
FIG. 10A is a cross-sectional view of the second test pattern according to an aspect of the present disclosure.
Figure 10B:
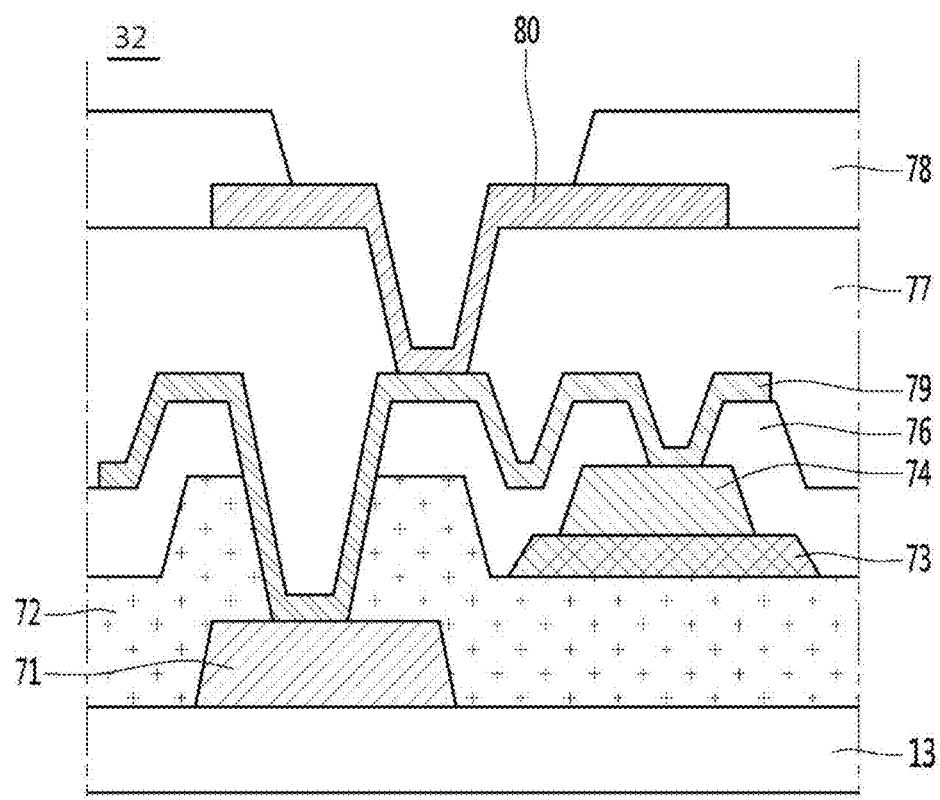
FIG. 10B is a cross-sectional view of a pad unit for measurement of the second test pattern according to an aspect of the present disclosure.

FIGS. 7 and 9 are photographic images of the first and second test patterns according to an aspect of the present disclosure. FIG. 8A is a cross-sectional view of the first test pattern according to an aspect of the present disclosure. FIG. 8B is a cross-sectional view of a pad unit for measurement of the first test pattern according to an aspect of the present disclosure. FIG. 10A is a cross-sectional view of the second test pattern according to an exemplary embodiment of the present disclosure. FIG. 10B is a cross-sectional view of a pad unit for measurement of the second test pattern according to an aspect of the present disclosure. Aspects of the present disclosure will be described below with reference to FIGS. 7 to 9 and FIGS. 10A and 10B.

As shown in FIG. 6, the first test pattern 11 according to an aspect of the present disclosure may be a pattern for evaluating the performance of a transistor and the second test pattern 12 may be a pattern for evaluating the performance of an optical detector.

Since an array substrate for an X-ray detector includes both a transistor and an optical detector in one pixel due to structural characteristics of the array substrate, characteristics of the transistor and the optical diode are mixed and derived during evaluation of the characteristics of one pixel. Accordingly, it is not possible to accurately evaluate the characteristics of each device.

Accordingly, according to an aspect of the present disclosure, separate test patterns for a transistor and an optical detector are used to overcome the aforementioned problem and, thus, defective products can be prevented and yield can be enhanced, so that costs and time for preventing defective products ca be lowered.

As shown in FIG. 8A, the first test pattern 11 may include a first gate electrode 41 on a substrate 13, a first active layer 43 over the first gate electrode 41, a first source/drain electrode 44 on the first active layer 43, and first data line 45 on the first source/drain electrode 44. As necessary, the first test pattern 11 may further include additional components.

The gate electrode, the active layer, the source/drain electrode, and the data line included in the first test pattern 11 may have the same materials as a gate electrode, an active layer, a source/drain electrode, and a data line formed in the active area. Further, the shape and the size of the first test pattern 11 are not particularly limited without departing from the scope and sprit of the present disclosure. More specifically, the shape and the size of the first test pattern 11 may be the same as those of the transistor of the active area.

As shown in FIG. 10A, the second test pattern 12 may include a first lower electrode 61 on the substrate 13, a first photoconductive layer 62 on the first lower electrode 61, and a first upper electrode 63 on the first photoconductive layer 62. As necessary, the second test pattern 12 may further include additional components.

The lower electrode, the photoconductive layer, and the upper electrode included in the second test pattern 12 may have the same materials as a lower electrode, an photoconductive layer, and an upper electrode formed in the active area and the shape and the size of the second test pattern 12 are not particularly limited without departing from the scope and sprit of the present disclosure. More specifically, the shape and the size of the second test pattern 12 may be the same as those of the optical detector of the active area.

According to an aspect of the present disclosure as described above, the test area may include the plurality of first and second test patterns 11 and 12. That is, the plurality of first and second test patterns 11 and 12 may be included in one test area. In this case, one specific first test pattern 11 may be used to evaluate characteristics of any one of transistors, and one specific second test pattern 12 may be used to evaluate characteristics of any one of optical detectors. Thus, a plurality of test patterns for evaluating different transistors and optical detectors may be included in one test area.

According to an aspect of the present disclosure, the pad area 10 may include a plurality of measurement pad units 31 and 32 that are electrically connected to at least one of the first test pattern 11 and the second test pattern 12.

According to the present disclosure, the measurement pad units 31 and 32 are patterns contacting the array substrate in order to evaluate characteristic of devices and are additional patterns other than the first test pattern 11 and the second test pattern 12.

Concurrently referring back to FIGS. 8B and 10B, the measurement pad units 31 and 32 may include a second gate electrode 51 and 71 on a substrate 13, a second active layer 53 and 73 on the second gate electrode 51 and 71, a second source/drain electrode 54 and 74 on the second active layer 53 and 73, a first insulation layer 56 and 76 on the second source/drain electrode 54 and 74, a second lower electrode 59 and 79 on the first insulation layer 56 and 76, a second insulation layer 57 and 77 on the second lower electrode 59 and 79, a bias line 60 and 80 on the second insulation layer 57 and 77, and a third insulation layer 58 and 68 on the bias line 60 and 80. The second lower electrode 59 and 79 may be electrically connected to the second gate electrode 51 and 71 through a first contact hole, electrically connected to the second source/drain electrode 54 and 74 through a second contact hole, and electrically connected to the bias line 60 and 80 through a third contact hole. The measurement pad units 31 and 32 may further include a second gate insulation layer 52 and 72 on the second gate electrode 51 and 71.

In this case, the gate electrode, the active layer, the source/drain electrode, the lower electrode, the bias line, the first insulation layer, the second insulation layer, and the third insulation layer included in the measurement pad units 31 and 32 may have the same materials as a gate electrode, an active layer, a source/drain electrode, a lower electrode, a bias line, a first protective layer, a second protective layer, and a third protective layer of an array substrate included in the active area according to the present disclosure. The shape and the size of the array substrate are not particularly limited without departing from the scope and sprit of the present disclosure. More specifically, the shape and the size of the array substrate may be the same as those of the components in the active area.

The pad area may include a plurality of measurement pad units for a specific test pattern according to an aspect of the present disclosure. Therefore, even if defects (e.g., corrosion) are caused in any one of the measurement pad units, the plurality of measurement pad units are spaced apart from each other in the form of an island, so as not to affect other measurement pad units.

As described above, the first test pattern 11 and the second test pattern 12 can be used to separately evaluate characteristics of a transistor and an optical detector. Further, each of the measurement pad units is separately connected to the transistor and the optical detector.

According to an aspect of the present disclosure, the first test pattern 11 may be configured to be connected to three measurement pad units 31. For example, one of the measurement pad units 31 may be connected to the first gate electrode 41 of the first test pattern 11, another measurement pad units 31 may be connected to the first data lines 45 of the first test pattern 11, and the other measurement pad units 31 may be connected to the first source/drain electrode 44 of the first test pattern 11. In this case, the measurement pad unit 31 connected to the first gate electrode 41 may apply a gate voltage to the first test pattern 11, the measurement pad unit 31 connected to the first data lines 45 may apply a data voltage to the first test pattern 11, and an electrical signal may be output through the measurement pad unit 31 connected to the first source/drain electrode 44.

According to an aspect of the present disclosure, the second test pattern 12 may be configured to be connected to two measurement pad units 32. For example, one of the measurement pad units 32 may be connected to the first upper electrode 63 of the second test pattern 12 and another measurement pad units 32 may be connected to the first lower electrode 61 of the second test pattern 12.

In the case of two measurement pad units 32 of the second test pattern 12, the measurement pad units 32 may be connected directly to the first upper electrode 63 and the first lower electrode 61 or may be connected through a contact hole formed in the bias line 60 of the second test pattern 12.

More specifically, when the second test pattern 12 and the measurement pad units 32 are directly connected to each other, one of the measurement pad units 32 may be connected to the first upper electrode 63 of the second test pattern 12 through the same layer and another measurement pad units 32 may be connected to the first lower electrode 61 of the second test pattern 12 through the same layer (i.e., the second lower electrode 79 of the measurement pad units 32).

When the second test pattern 12 and the measurement pad units 32 are indirectly connected through a contact hole formed in the bias line 80, an electrical signal may be input to the first upper electrode 63 of the second test pattern 12 through a contact hole formed in the bias line 80 of the measurement pad units 32 and an electrical signal may be output through a contact hole formed in the second source/drain electrode 74 of the measurement pad units 32.

The X-ray detector according to the present disclosure may include the aforementioned array substrate 100 for an X-ray detector according to the present disclosure (Hereinafter, referring back to FIGS. 3 and 5).

In this case, the array substrate may correspond to the array substrate 100 according to the present disclosure and, thus, a repeated configuration and effect within the aforementioned scope will be omitted here.

The optical detector 200 shown in FIGS. 3 and 5 included in the X-ray detector according to the present disclosure may have a function of converting an optical signal that is incident thereon into a visible ray wavelength range through an optical converter to be described later into an electric detection signal, and the amount of current flowing in an optical detector may be changed according to the amount of transmitted light. For example, the optical detector 200 may be a PIN diode.

The optical detector 200 may include the lower electrode 26 of the array substrate 100, a photoconductor layer 25 on the lower electrode 26, and the upper electrode 27 on the photoconductor layer 25. The photoconductor layer 25 may include an n-type semiconductor layer including an n-type impurity, an intrinsic semiconductor layer that does not include any dopants, and a p-type semiconductor layer including a p-type impurity.

The lower electrode 26 of the optical detector 200 may be electrically connected to the drain electrode 23 of the transistor and the upper electrode 27 may be electrically connected to the bias line to which a bias voltage is applied.

The optical converter 300 shown in FIGS. 3 and 5 included in the X-ray detector according to the present disclosure may be disposed on the optical detector 200, more specifically, on the second insulation film of the array substrate 100.

The optical converter 300 may convert an X-ray transmitted from an X-ray generator through a target object into green light having a wavelength of about 550 nm of a visible ray range and transmit the green light to the pixel area. The optical converter 300 may be formed of, for example, a cesium iodide compound.

The X-ray detector according to the present disclosure may include an array substrate for an X-ray detector according to the present disclosure, so as to include test patterns for a transistor and an optical detector in the array substrate, thereby improving characteristic evaluation. In addition, test patterns may be separately used for the transistor and the optical detector, so that mixed evaluation of the characteristics of the transistor and the optical detector can be avoided, thereby improving yield.

Voltage-current characteristics are measured on the array substrate for an X-ray detector according to an aspect of the present disclosure that includes a first test pattern and a second test pattern in a pad area. Also, voltage-current characteristics are measured on an array substrate (comparative example) that is the same as the aspect of the present disclosure except that a transistor test pattern and an optical detector test pattern are disposed in an edge portion of the array substrate. The compared measurements results are shown in FIGS. 11 and 12.

Figure 11:
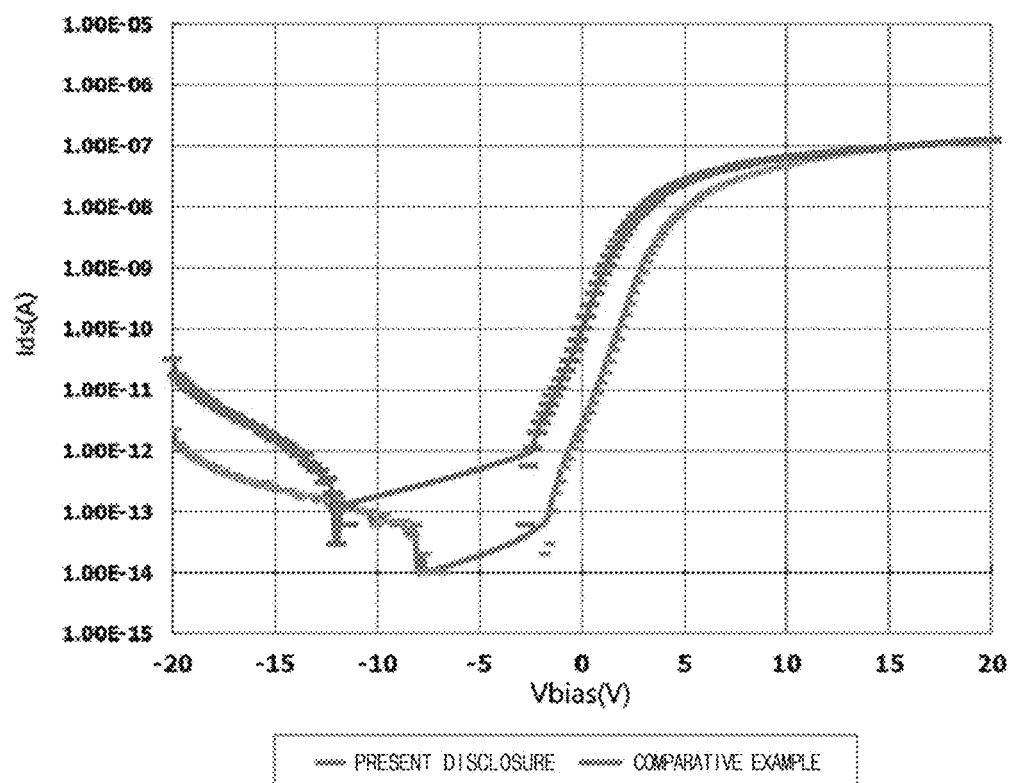
FIG. 11 is a graph showing voltage-current characteristics of a transistor, measured using the first test pattern according to an aspect of the present disclosure and a test pattern according to a comparative example

FIG. 11 is a graph showing voltage-current characteristics of a transistor, measured using a first test pattern according to an aspect of the present disclosure and a test pattern according to a comparative example. FIG. 12 is a graph showing voltage-current characteristics of an optical diode, measured using a second test pattern according to an aspect of the present disclosure and a test pattern according to a comparative example.

Figure 12:
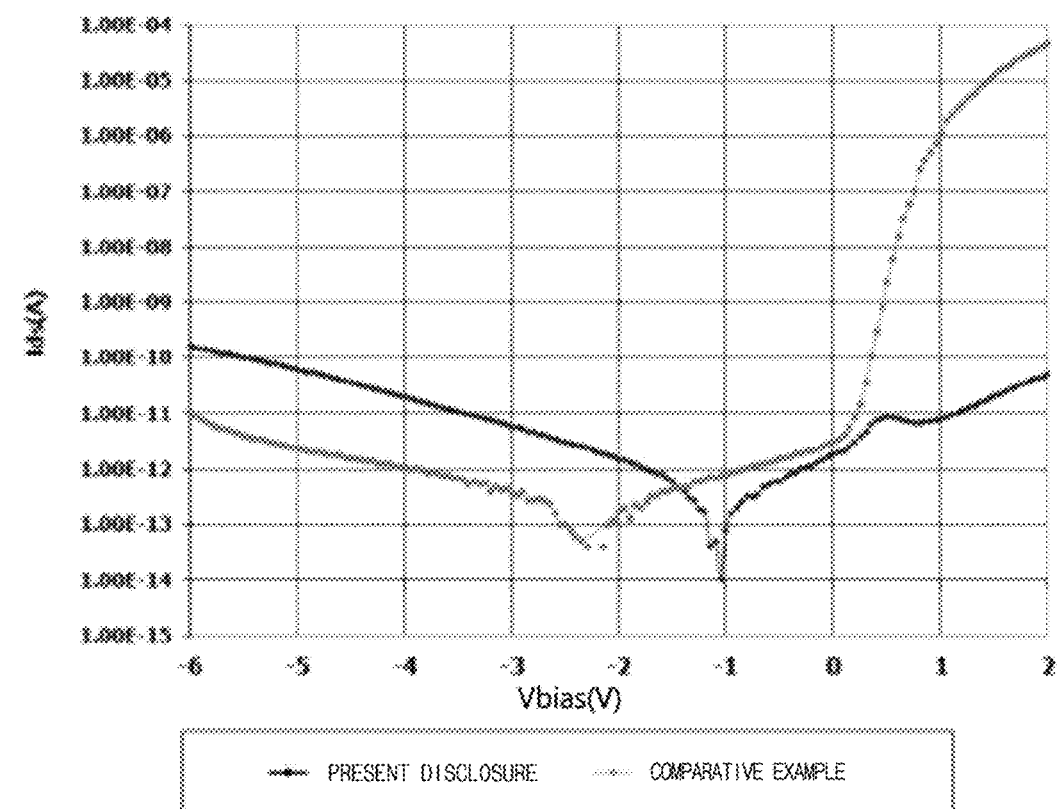
FIG. 12 is a graph showing voltage-current characteristics of an optical diode, measured using the second test pattern according to an aspect of the present disclosure and a test pattern according to the comparative example.

As seen in FIGS. 11 and 12, there is a significant difference between an aspect of the present disclosure and the comparative example and, thus, according to the present disclosure, the characteristics of the transistor and the optical detector can be determined and measurement accuracy can also be improved.

The array substrate for an X-ray detector according to the present disclosure may measure the characteristic of each of the transistor and the optical detector with a high accuracy, so as to lower the failure rate of the array substrate. In addition, defective products can be avoided.

The X-ray detector according to the present disclosure can accurately determine the characteristics of the transistor and the optical detector included in the array substrate of the X-ray detector, thereby improving production yield.

It will be apparent to those skilled in the art that various modifications and variations can be made in the array substrate for an X-ray detector and the X-ray detector including the array substrate of the present disclosure without departing from the spirit or scope of the disclosure. Thus, it is intended that present disclosure cover the modifications and variations of this disclosure provided they come within the scope of the appended claims and their equivalents.

What is claimed is:

1. An array substrate for an X-ray detector having a transistor and an optical detector, comprising:
   a pad area comprising a plurality of test areas, each test area comprising a first test pattern for evaluating the transistor and a second test pattern for evaluating the optical detector separately;
   a first plurality of measurement pad units electrically connected to the first test pattern; and
   a second plurality of measurement pad units electrically connected to the second test pattern,
   wherein the first test pattern comprises a first gate electrode on a substrate, a first active layer on the first gate electrode, a first source electrode and a first drain electrode on the first active layer, and a first data line on the first source electrode, and the second test pattern comprises a first lower electrode on the substrate, a first photoconductive layer on the first lower electrode, and a first upper electrode on the first photoconductive layer.

2. The array substrate according to claim 1, wherein the pad area comprises a plurality of chip on films (COFs) and a plurality of connection lines; and
   each of the plurality of test areas is disposed between adjacent COFs and between the connection lines.

3. The array substrate according to claim 1, wherein each of the measurement pad units comprises a second gate electrode on the substrate, a second active layer on the second gate electrode, a second source electrode and a second drain electrode on the second active layer, a first insulation layer on the second source electrode and the second drain electrode, a second lower electrode on the first insulation layer, a second insulation layer on the second lower electrode, a bias line on the second insulation layer, and a third insulation layer on the bias line; and the second lower electrode is electrically connected to the second gate electrode through a first hole, is electrically connected to the second drain electrode through a second hole, and is electrically connected to the bias line through a third hole.

4. The array substrate according to claim 1, wherein the first plurality of measurement pad units comprises first, second and third measurement pad units connected to the first test pattern.

5. The array substrate according to claim 4, wherein the first measurement pad unit is connected to the first gate electrode, the second measurement pad unit is connected to the first data line, and the third measurement pad unit is connected to the first source electrode or the first drain electrode.

6. The array substrate according to claim 1, wherein the second plurality of measurement pad units comprises first and second measurement pad units connected to the second test pattern.

7. The array substrate according to claim 6, wherein the first measurement pad unit is connected to the first upper electrode and the second measurement pad unit is connected to the first lower electrode.

8. The array substrate according to claim 6, wherein the first and second measurement pad units connected to the second test pattern are connected to the first upper electrode and the first lower electrode directly or through a contact hole.

9. A pad area of an array substrate for an X-ray detector having a transistor and an optical detector, comprising:
a plurality of test areas, each having a first test pattern for evaluating the transistor and a second test pattern for evaluating the optical detector separately, and
a first plurality of measurement pad units electrically connected to the first test pattern; and
a second plurality of measurement pad units electrically connected to the second test pattern;
wherein the first test pattern comprises a first gate electrode on a substrate, a first active layer on the first gate electrode, a first source electrode and a first drain electrode on the first active layer, and a first data line on the first source electrode, and the second test pattern comprises a first lower electrode on the substrate, a first photoconductive layer on the first lower electrode, and a first upper electrode on the first photoconductive layer.

10. The pad area according to claim 9, further comprising a plurality of chip on films (COFs) and a plurality of connection lines.

11. The pad area according to claim 10, wherein each of the plurality of test areas is disposed between the adjacent COFs and between the connection lines.

12. The pad area according to claim 9, wherein the first test pattern is connected to first, second and third measurement pad units of the first plurality of measurement pad units.

13. The pad area according to claim 12, wherein the first measurement pad unit is connected to the first gate electrode, the second measurement pad unit is connected to the first data line, and the third measurement pad unit is connected to the first source electrode or the first drain electrode.

14. The pad area according to claim 9, wherein the second test pattern is connected to first and second measurement pad units of the second plurality of measurement pad units.

15. The pad area according to claim 14, wherein the first measurement pad unit is connected to the first upper electrode and the second measurement pad units is connected to the first lower electrode.

16. The pad area according to claim 14, wherein the first and second measurement pad units connected to the second test pattern are respectively directly connected to the first upper electrode and the first lower electrode or through a contact hole.

17. An X-ray detector having a transistor and an optical detector, comprising:
an array substrate comprising a pad area comprising a plurality of test areas, each having a first test pattern for evaluating the transistor and a second test pattern for evaluating the optical detector separately;
a first plurality of measurement pad units electrically connected to the first test pattern; and
a second plurality of measurement pad units electrically connected to the second test pattern;
wherein the first test pattern comprises a first gate electrode on a substrate, a first active layer on the first gate electrode, a first source electrode and a first drain electrode on the first active layer, and a first data line on the first source electrode, and the second test pattern comprises a first lower electrode on the substrate, a first photoconductive layer on the first lower electrode, and a first upper electrode on the first photoconductive layer.

* * * * *